United States Patent [19]

Takao

[11] Patent Number: 5,452,247
[45] Date of Patent: Sep. 19, 1995

[54] THREE-DIMENSIONAL STATIC RANDOM ACCESS MEMORY DEVICE FOR AVOIDING DISCONNECTION AMONG TRANSISTORS OF EACH MEMORY CELL

[75] Inventor: Yoshihiro Takao, Kanagawa, Japan

[73] Assignee: Fujitsu Limited, Kanagawa, Japan

[21] Appl. No.: 389,975

[22] Filed: Feb. 14, 1995

Related U.S. Application Data

[63] Continuation of Ser. No. 141,554, Oct. 26, 1993, abandoned, which is a continuation of Ser. No. 628,029, Dec. 17, 1990, abandoned.

[30] Foreign Application Priority Data

Dec. 20, 1989 [JP] Japan .................. 1-332408

[51] Int. Cl.6 .................. G11C 11/40; H01L 29/10
[52] U.S. Cl. .................. 365/182; 365/154; 257/382; 257/385; 257/903
[58] Field of Search .................. 365/182, 154, 156; 357/42, 23.1, 45, 49, 59, 41; 257/903, 382, 385

[56] References Cited

U.S. PATENT DOCUMENTS

| | | | |
|---|---|---|---|
| 4,209,716 | 6/1980 | Raymond, Jr. .................. | 257/385 |
| 4,481,524 | 11/1984 | Tsujide .................. | 357/42 |
| 4,524,377 | 6/1985 | Eguchi .................. | 357/42 X |
| 4,613,886 | 9/1986 | Chwang .................. | 357/42 |
| 4,698,659 | 10/1987 | Mizutani .................. | 357/42 |
| 4,724,530 | 2/1988 | Dingwall .................. | 357/42 X |
| 4,814,841 | 3/1989 | Masuoka et al. .................. | 357/23.5 |
| 4,890,148 | 12/1989 | Ikeda et al. .................. | 357/45 |
| 4,980,732 | 12/1990 | Okazawa .................. | 357/42 X |
| 5,034,797 | 7/1991 | Yamanaka et al. .................. | 357/42 |
| 5,057,898 | 10/1991 | Adan et al. .................. | 357/59 |

OTHER PUBLICATIONS

"Three–Dimensional SRAM-Cell Fabricated with a Laser-Recrystallization Technology", Sasaki et al, The 16th Conference Solid State Devices and Materials, Late News, LC-12-6, Final Program and Late News Abstracts, pp. 72–73, (1984).

"4 PMOS/2 NMOS Vertically Stacked CMOS-SRAM with 0.6 μm Design Rule", Inoue et al, Symposium on VLSI Tech. Dig., pp. 39–40, (1989).

"Three–Dimensional SOI MOS Device Having a Possibility of Large Scale Integration", Sasaki et al, Electronic Material, pp. 74–79, Jun., 1985.

Primary Examiner—David C. Nelms
Assistant Examiner—Son Dinh
Attorney, Agent, or Firm—Armstrong, Westerman, Hattori, McLeland & Naughton

[57] ABSTRACT

A gate electrode layer constituting a gate of a P-channel type MOS transistor formed on an upper layer is made of P-type polycrystal silicon and is connected to a diffusion region of an N-channel type MOS transistor formed on a lower layer by extending an end of the gate electrode layer into a contact hole above the diffusion region. Therefore, an aspect ratio of the contact hole becomes small and a coverage of a wiring for connecting the gate of the P-channel type MOS transistor and the diffusion region of the N-channel type MOS transistor is improved, so that the wiring is not snapped.

17 Claims, 9 Drawing Sheets

THREE-DIMENSIONAL STATIC RANDOM ACCESS MEMORY DEVICE FOR AVOIDING DISCONNECTION AMONG TRANSISTORS OF EACH MEMORY CELL

This application is a continuation application Ser. No. 08/141,554 filed Oct. 26, 1993, now abandoned, which was a continuation application of Ser. No. 07/628,029, filed Dec, 17, 1990, now abandoned.

BACKGROUND OF THE INVENTION

1. Field of the Invention

The present invention relates to a static random access memory (SRAM) device, more particularly, to a static random access memory device using melt-recrystallization technology and silicon on insulator (SOI) technology.

2. Description of the Related Art

Conventionally, a SRAM is used for maintaining data by a battery back up, and a memory cell for the SRAM is preferably used for a full CMOS configuration to decrease a power consumption thereof. Namely, the memory cell for the SRAM is constituted by two CMOS inverters and two switching transistors. For example, the switching transistors are constituted by N-channel type MOS (or MIS: Metal Insulator Semiconductor) transistors, and each of the CMOS inverters is constituted by a P-channel type MOS transistor and an N-channel type MOS transistor.

Note, six transistors of the memory cell for the SRAM are practically formed as a three-dimensional configuration to increase an integration thereof by using SOI technology. Namely, in this memory cell, four N-channel type MOS transistors are formed on a substrate (lower layer), an interlayer insulation film is formed on the N-channel type MOS transistors, and two P-channel type MOS transistors are formed on a melt-recrystallization silicon layer (upper layer) which is formed on the interlayer insulation film, or above the lower layer. Further, the P-channel type MOS transistors formed on the upper layer are connected to the N-channel type MOS transistors formed on the lower layer through contact holes formed in the interlayer insulation film by aluminium wiring.

For example, in the memory cell for the SRAM according to the prior art, a gate of a P-channel type MOS transistor formed on the upper layer of a first CMOS inverter is connected to a drain region of an N-channel type switching MOS transistor, and a gate of an N-channel type MOS transistor is formed on the lower layer of a second CMOS inverter by filling aluminium into a contact hole above the drain region of the switching transistor. Therefore, an aspect ratio of the contact hole becomes large and a coverage of the aluminium wiring becomes bad, and thus the aluminium wiring may be snapped.

SUMMARY OF THE INVENTION

It is an object of the present invention to provide a static random access memory device having a contact hole with a small aspect ratio and an improved wiring coverage.

According to the present invention, there is provided a static random access memory device having a plurality of memory cells formed as a three-dimensional configuration, each of the memory cells including: a lower layer of a substrate; a plurality of first conductivity type MIS transistors formed on the lower layer; an interlayer insulation film formed on the first conductivity type MIS transistors; an upper layer formed on the interlayer insulation film; a plurality of second conductivity type MIS transistors formed on the upper layer; a contact hole formed in the interlayer insulation film at the portion above a diffusion region of one of the first conductivity type MIS transistors; and a polycrystal silicon film layer of a gate of one of the second conductivity type MIS transistors connected to the diffusion region through the contact hole.

The memory cell may further comprise a polycrystal silicon pad provided at a connection portion between the polycrystal silicon film layer and the diffusion region. The substrate may be constituted by a silicon substrate, and the upper layer may be constituted by a melt-recrystallization layer. A gate electrode layer of another one of the first conductivity type MIS transistors may be connected to the diffusion region through the polycrystal silicon pad. The gate electrode layer of the another one of the first conductivity type MIS transistors may be made of N-type tungusten silicide.

The first conductivity type MIS transistors may be constituted by a first, second, third, and fourth N-channel type MIS transistors, and the second conductivity type MIS transistors may be constituted by a fifth and a sixth P-channel type MIS transistors. The memory cell may be constituted by a first CMIS inverter consisting of the fifth transistor of the P-channel type and the third transistor of the N-channel type, a second CMIS inverter consisting of the sixth transistor of the P-channel type and the fourth transistor of the N-channel type, and two switching transistors using the first and second N-channel type transistors, wherein an output of the first CMIS inverter is connected to an input of the second CMIS inverter, an output of the second CMIS inverter is connected to an input of the first CMIS inverter, gates of the two switching transistors are connected to a word line, and sources of the two switching transistors are connected to bit lines. Further, a first diode may be provided between the fifth transistor and the third transistor in the first CMIS inverter, and a second diode may be provided between the sixth transistor and the fourth transistor in the second CMIS inverter.

The polycrystal silicon film layer may constitute a gate electrode of one of the second conductivity type MIS transistors. The diffusion region may be specified as a drain region of an N-channel type MIS switching transistor of the memory cell.

Furthermore, according to the present invention, there is also provided a static random access memory device having a plurality of memory cells formed as a three-dimensional configuration, each of the memory cells including: a lower layer of a substrate; four MIS transistors of a first conductivity type formed on the lower layer; an interlayer insulation film formed on the first conductivity type MIS transistors; an upper layer formed on the interlayer insulation film; two MIS transistors of a second conductivity type formed on the upper layer; a first contact hole formed in the interlayer insulation film at the portion above a first diffusion region of one of the first conductivity type MIS transistors; a metal wiring layer connected to the first diffusion region through the first contact hole; a second contact hole formed in the interlayer insulation film at the portion above a second diffusion region of one of the first conductivity type MIS transistors; and a polycrystal silicon film layer of a gate of one of the second conductivity type MIS transistors connected to the second diffusion region through the second contact hole.

The memory cell may further comprise a first and a second polycrystal silicon pads, the first polycrystal silicon pad being provided at a connection portion between the metal wiring layer and the first diffusion region, and the second polycrystal silicon pad being provided at a connection portion between the polycrystal silicon film layer and the second diffusion region. A gate electrode layer of another one of the first conductivity type MIS transistors may be connected to the second diffusion region through the second polycrystal silicon pad. The gate electrode layer of the another one of the first conductivity type MIS transistors may be made of N-type tungusten silicide.

The four MIS transistors of the first conductivity type may be constituted by a first, second, third, and fourth transistors of an N-channel type, and the two MIS transistors of the second conductivity type may be constituted by a fifth and sixth transistors of P-channel type. The metal wiring layer may be specified as a bit line. The first diffusion region may be specified as a source region of an N-channel type MIS switching transistor of the memory cell, and the second diffusion region may be specified as a drain region of the N-channel type MIS switching transistor.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

First, a static random access memory device (SRAM) according to the prior art will be explained, with reference to FIGS. 1 to 6.

Figure 1:
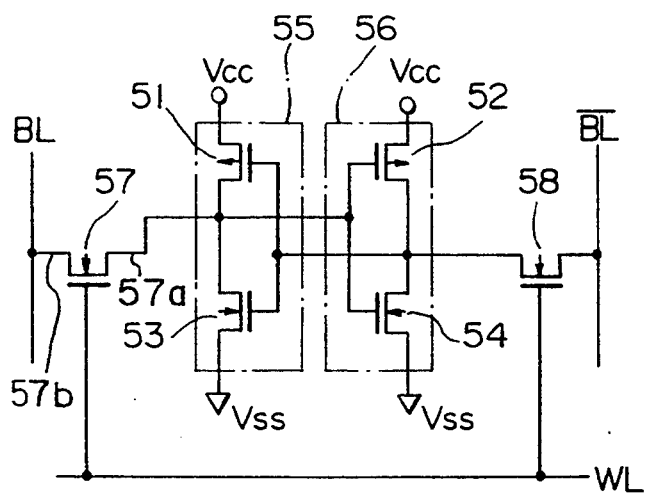
FIG. 1 is a circuit diagram showing an example of a memory cell in a SRAM according to the prior art.

FIG. 1 is a circuit diagram showing an example of a memory cell in a SRAM according to the prior art, and the memory cell for the SRAM is constituted by only CMOS (CMIS) transistors to reduce power consumption thereof.

As shown in FIG. 1, the memory cell comprises two CMOS inverters 55, 56, and two switching transistors 57, 58 which are constituted by N-channel type MOS transistors. The CMOS inverter 55 is constituted by a P-channel type MOS transistor 51 and an N-channel type MOS transistor 53, and the CMOS inverter 56 is constituted by a P-channel type MOS transistor 52 and an N-channel type MOS transistor 54. An output of the CMOS inverter 55 is connected to an input of the CMOS inverter 56 and a drain of the switching transistor 57, and an output of the CMOS inverter 56 is connected to an input of the CMOS inverter 55 and a drain of the switching transistor 58. A source of the switching transistor 57 is connected to a bit line BL and a gate thereof is connected to a word line WL, and a source of the switching transistor 58 is connected to an inverted bit line $\overline{BL}$ and a gate thereof is connected to the word line WL.

Figure 3:
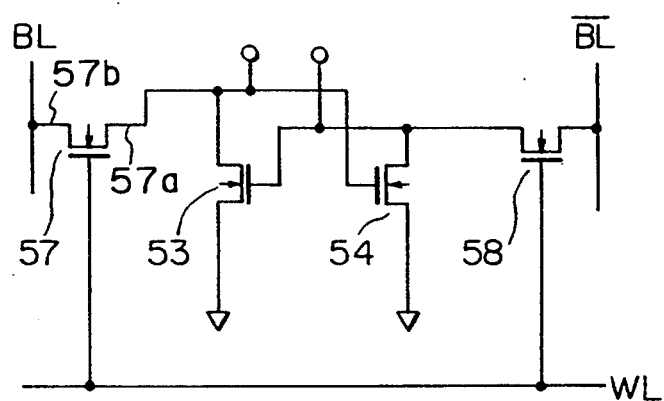
FIG. 3 is a circuit diagram showing the configuration of the lower layer shown in FIG. 2.
Figure 2:
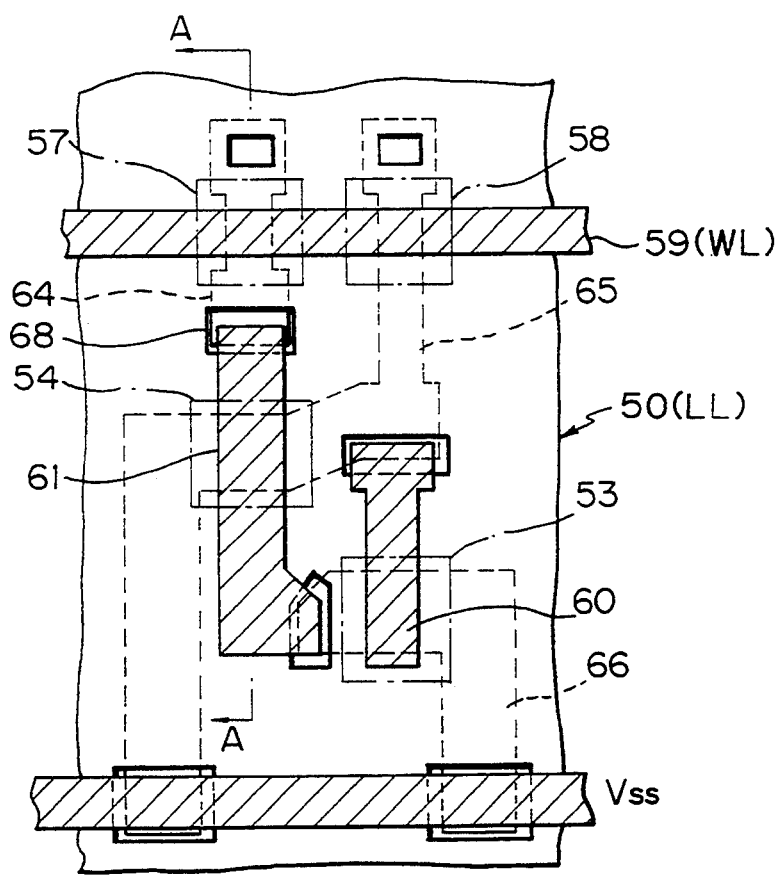
FIG. 2 is a plan view showing an example of a configuration of a lower layer in the memory cell shown in FIG. 1.

FIG. 2 is a plan view showing an example of a configuration of a lower layer in the memory cell shown in FIG. 1, and FIG. 3 is a circuit diagram showing the configuration of the lower layer shown in FIG. 2. As shown in FIGS. 2 and 3, the N-channel type MOS transistors 53, 54, 57, 58 are formed on a substrate 50 (lower layer LL). As shown in FIG. 3, these transistors 53, 54, 57, 58 are connected to the bit lines BL, $\overline{BL}$, the word line WL, and to each other by bulk wiring or aluminium wiring.

Figure 4:
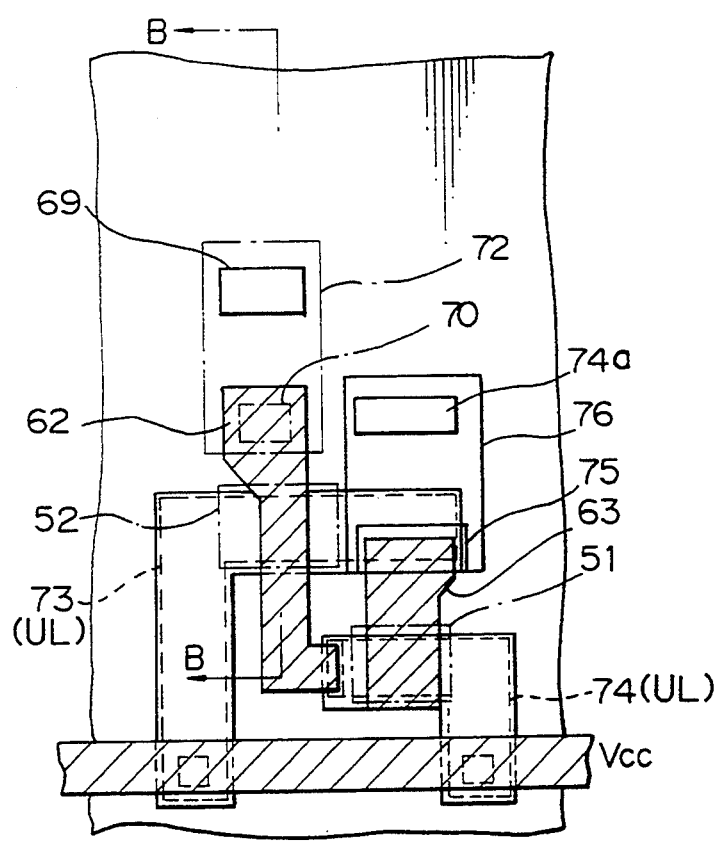
FIG. 4 is a plan view showing an example of a configuration of an upper layer in the memory cell shown in FIG. 1.
Figure 5:
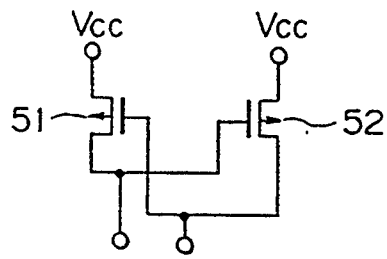
FIG. 5 is a circuit diagram showing the configuration of the upper layer shown in FIG. 4.

FIG. 4 is a plan view showing an example of a configuration of an upper layer in the memory cell shown in FIG. 1, and FIG. 5 is a circuit diagram showing the configuration of the upper layer shown in FIG. 4. As shown in FIGS. 4 and 5, the P-channel type MOS transistors 51, 52 are formed on melt-recrystallization silicon layers 73, 74 (upper layer UL). As shown in FIG. 5, these transistors 51, 52 are connected to each other by aluminium wiring.

Figure 6:
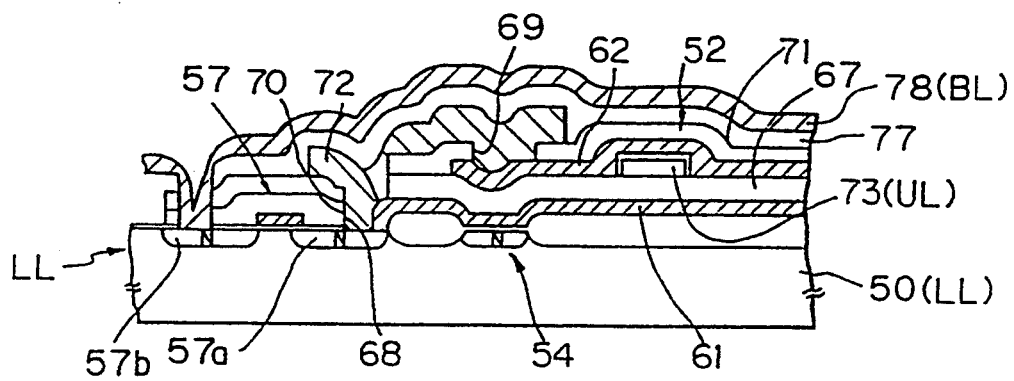
FIG. 6 is a sectional diagram showing an example of the memory cell in the SRAM according to the prior art.

FIG. 6 is a sectional diagram showing an example of the memory cell in the SRAM according to the prior art, and corresponds to the sectional diagram of the memory cell shown in FIG. 2 by cutting along a cutting line A—A or the memory cell shown in FIG. 4 by cutting along cutting line B—B.

As shown in FIG. 6, the N-channel type MOS transistors 54, 57 are formed on the lower layer LL, a first interlayer insulation film 67 is formed over the transistors 54, 57, the upper layer UL is formed on the first interlayer insulation film 67, and the P-channel type MOS transistor 52 is formed on the upper layer UL.

Note, the P-channel type MOS transistors 51, 52 formed on the upper layer UL are connected to the N-channel type MOS transistors 53, 54, 57, 58 formed on the lower layer LL through contact holes formed in the interlayer insulation film by aluminium wiring.

For example, as shown in FIG. 6, a drain region 57a of the N-channel type MOS transistor 57, a gate of which is connected to the word line WL, is connected to a gate of the N-channel type MOS transistor 54 and a gate of the P-channel type MOS transistor 52. Namely, the drain region 57a of the transistor 57 is connected to the gate of the transistor 54 through a first contact hole 68 by a gate electrode layer 61 which is electrically connected to the gate of the transistor 54 (or the gate of the transistor 54 is constituted by the gate electrode layer 61). Note, the first contact hole 68 formed in a thermal oxide film, and this first interlayer insulation film 67 is formed over the transistors 54 and 57.

Further, the drain region 57a of the transistor 57 is connected to the gate of the transistor 52 which is formed on the first interlayer insulation film 67 through a second contact hole 69 and a third contact hole 70. Note, the second contact hole 69 is formed at the portion over a gate electrode layer 62 which is electrically connected to the gate of the transistor 52 in a second interlayer insulation film 71 (or the gate of the transistor 52 is constituted by the gate electrode layer 62), the third contact hole 70 is formed at the portion corresponding to the first contact hole 68 in the second interlayer insulation film 71, and an aluminium electrode 72 is formed on the second interlayer insulation film 71, so that the drain region 57a of the transistor 57 (or the gate of the transistor 54) is connected to the gate of the transistor 52 by the aluminium electrode 72 through the three contact holes 68, 69, 70.

Namely, as shown in FIG. 6, the gate of the P-channel type MOS transistor 52 is connected to the drain region 57a of the N-channel type MOS transistor 57 and the gate of the N-channel type MOS transistor 54 by filling aluminium (Al) into the first contact hole 68, the second contact hole 69, and the third contact hole 70. Note, in FIG. 6, a reference numeral 77 denotes a third interlayer insulation film, and 78 denotes an aluminium wiring used as the bit line BL.

In FIGS. 2 and 4, a reference numeral 74a denotes a contact hole to connect a gate of the P-channel type MOS transistor 51 to a gate of the N-channel type MOS transistor 53 by gate electrode layers 60 and 63, 75 denotes a contact hole to connect a drain of the P-channel type MOS transistor 52 to a gate of the P-channel type MOS transistor 51, and 76 denotes an aluminium wiring continuously formed on the contact holes 74a, 75. Note, the contact hole 75 is formed over the melt-recrystallization silicon layer 73 in an insulation layer. Further, the gate electrode layer 60 is electrically connected to the gate of the transistor 53 (or the gate of the transistor 53 is constituted by the gate electrode layer 60), and the gate electrode layer 63 is electrically connected to the gate of the transistor 51 (or the gate of the transistor 51 is constituted by the gate electrode layer 63).

As described above, in the memory cell for the SRAM according to the prior art, the gate of the P-channel type MOS transistor 52 formed on the upper layer UL is connected to the drain region 57a of the N-channel type MOS transistor 57 and the gate of the N-channel type MOS transistor 54 formed on the lower layer LL by filling aluminium into the first contact hole 68, the second contact hole 69, and the third contact hole 70. Note, the first contact hole 68 is formed in the thermal oxide film, and the third contact hole 70 is formed in the second interlayer insulation film 71. Therefore, an aspect ratio of the contact hole formed by both first and third contact holes 68, 70 becomes large and coverage of the aluminium wiring becomes bad, so that the aluminium wiring may be snapped. Furthermore, in a connection portion between the aluminium wiring 78 (bit line BL) and a source region 57b, an aspect ratio of the contact hole is so large that the aluminium wiring may be snapped or aluminium of the wiring may not be contacted to the source region 57b.

Figure 7:
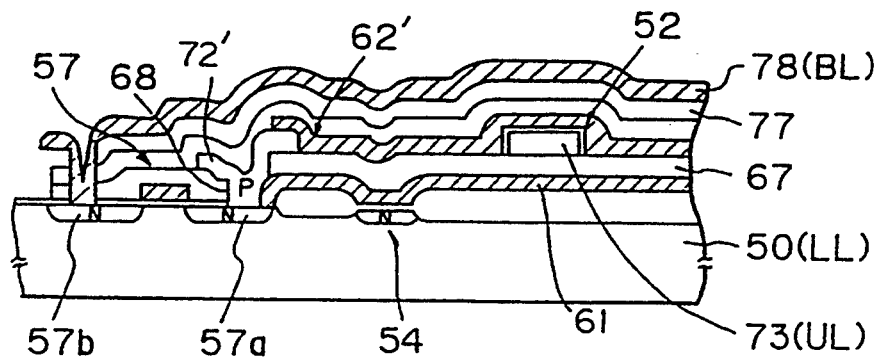
FIG. 7 is a sectional diagram showing an example of a memory cell in a SRAM according to the related art.

FIG. 7 is a sectional diagram showing an example of a memory cell in a SRAM according to the related art. In the memory cell shown in FIG. 7, a melt-recrystallization silicon layer 72' is filled into the first contact hole 68, and a gate electrode layer 62 connected to the gate of the P-channel MOS transistor 52 is formed on an end portion of the melt-recrystallization silicon layer 72', so that the gate of the P-channel type MOS transistor 52 is connected to the drain region 57a of the N-channel type MOS transistor 57 and the gate of the N-channel type MOS transistor 54 without increasing the aspect ratio of the contact hole and causing the wiring to snap.

Nevertheless, when irradiating a laser beam onto a silicon layer to form the melt-recrystallization silicon layer 72', an internal portion of the first contact hole 68 is heated, and impurities in the drain region 57a of the transistor 57 positioned under the first contact hole 68 are diffused into the melt-recrystallization silicon layer 72' at the internal portion of the first contact hole 68, so that P-type impurities in the melt-recrystallization silicon layer 72' are compensated by N-type impurities diffused into the melt-recrystallization silicon layer 72' from the drain region 57a.

Therefore, a resistance value of the melt-recrystallization silicon layer 72' at the internal portion of the first contact hole 68 becomes large, and electrical contact between the drain region 57a of the N-channel type MOS transistor 57 and the gate electrode layer 62 (or the gate of the P-channel type MOS transistor 52) cannot be obtained. Furthermore, in a connection portion between the aluminium wiring 78 (bit line BL) and a source region 57b of the N-channel type MOS transistor 57, an aspect ratio of the contact hole is so large that the aluminium wiring may be snapped or aluminium of the wiring may not be contacted to the source region 57b.

Next, the preferred embodiments of a memory cell for a SRAM according to the present invention will be explained.

Figure 8:
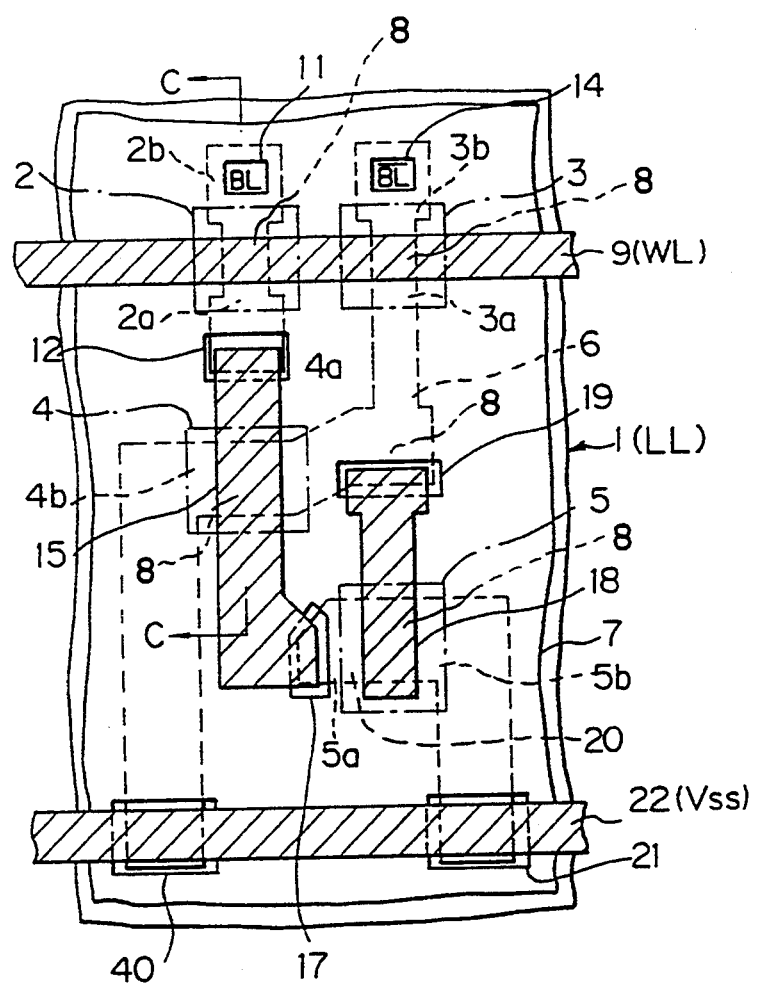
FIG. 8 is a plan view showing a configuration of a lower layer of a memory cell in an embodiment of a SRAM according to the present invention.
Figure 9:
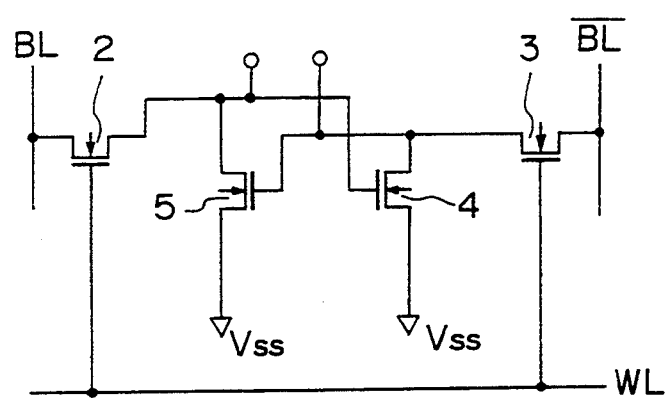
FIG. 9 is a circuit diagram showing the configuration of the lower layer shown in FIG. 8.

FIG. 8 is a plan view showing a configuration of a lower layer of a memory cell in an embodiment of a SRAM according to the present invention, and FIG. 9 is a circuit diagram showing the configuration of the lower layer shown in FIG. 8.

In FIG. 8, a reference numeral 1 denotes a semiconductor substrate made of P-type silicon, and a first element formation region 2, a second element formation region 3, a third element formation region 4, and a fourth element formation region 5 are formed on the surface of the substrate 1. Note, each of the four element formation regions 2 to 5 is used to form an N-channel type MOS transistor (which is also shown by the reference numeral 2, 3, 4, or 5), and the second element formation region 3 and the third element formation region 4, which are diagonally located are electrically connected by an N-type element connection region 6. Further, the four element formation regions 2 to 5 and the element connection region 6 are surrounded by an insulation layer (oxide film) 7, and this oxide film 7 is formed by using a selective oxidation method. Additionally, a thermal oxide film 8 is formed over the element formation regions 2 to 5 and the element connection region 6 (with reference to FIG. 12), and this thermal oxide film 8 is formed by using a thermal oxidation method.

Further, a reference numeral 9 denotes a first gate electrode layer formed crossing the first element formation region 2 and the second element formation region 3, and the first gate electrode layer 9 is used as a word line WL and is connected to gates of the N-channel type MOS transistors 2 and 3 (or the gates of the transistor 2 and 3 are constituted by the first gate electrode layer 9). In the first element formation region 2, N-type diffusion regions (a drain region and a source region) 2a and 2b are formed on both sides of the gate thereof. Note, a part of the N-type diffusion region 2a is exposed through the thermal oxide film 8 from a first contact hole 11, and a part of the N-type diffusion region 2b is exposed through the thermal oxide film 8 from a second contact hole 12. Similarly, in the second element formation region 3, N-type diffusion regions (a drain region and a source region) 3a and 3b are formed on both sides of the gate thereof. Note, a part of the N-type diffusion region 3b is exposed through the thermal oxide film 8 from a third contact hole 14, and the N-type diffusion region 2a is connected to one end of the element connection region 6.

Next, in FIG. 8, a reference numeral 15 denotes a second gate electrode layer formed onto the thermal oxide film 8 at the portion over the third element formation region 4 (or the gate of the transistor 4 is constituted by the second gate electrode layer 15), and the element connection region 6 is positioned at the side of the second gate electrode layer 15. One end of the second gate electrode layer 15 is connected to the N-type diffusion region (drain region) 2a of the first element formation region 2 through the second contact hole 12, and the other end of the second gate electrode layer 15 is connected to an N-type diffusion region 5a of the fourth element formation region 5 through a fourth contact hole 17. In the third element formation region 4, N-type diffusion regions 4a and 4b are formed on both sides of the second gate electrode layer 15.

Further, a reference numeral 18 denotes a third gate electrode layer formed onto the thermal oxide film 8 at the portion over the fourth element formation region 5 (or the gate of the transistor 5 is constituted by the third gate electrode layer 18). One end of the third gate electrode layer 18 is connected to the element connection region 6 through a fifth contact hole 19, and the fifth contact hole 19 is formed in the thermal oxide film 8. In the fourth element formation region 5, N-type diffusion regions 5a and 5b are formed on both sides of the third gate electrode layer 18. Note, the diffusion region 5a is exposed through the thermal oxide film 8 from the fourth contact hole 17 and is electrically connected to the second gate electrode layer 15, and the diffusion region 5b is exposed through the thermal oxide film 8 from the sixth contact hole 21 and is electrically connected to a power supply electrode layer 22 (low potential power supply electrode layer, or ground Vss).

Note, in FIG. 8, a reference numeral 40 denotes a contact hole (an eleventh contact hole) formed in the thermal oxide film 8, and this eleventh contact hole 40 is used to connect the diffusion region 4b of the transistor 4 to the ground Vss (low potential power supply electrode layer 22).

In the above description, four N-channel type MOS transistors 2 to 5 are formed in four corresponding element formation regions 2 to 5 on the semiconductor substrate 1 (lower layer LL), and the four N-channel type MOS transistors 2 to 5 are connected as in the circuit diagram shown in FIG. 9. Namely, as shown in FIG. 9, a drain of a first N-channel type MOS transistor 2 is connected to a drain of a fourth N-channel type MOS transistor 5 and a gate (second gate electrode layer 15) of a third N-channel type MOS transistor 4, and a drain of a second N-channel type MOS transistor 3 is connected to a drain of the third N-channel type MOS transistor 4 and a gate (third gate electrode layer 18) of the fourth N-channel type MOS transistor 5.

Figure 10:
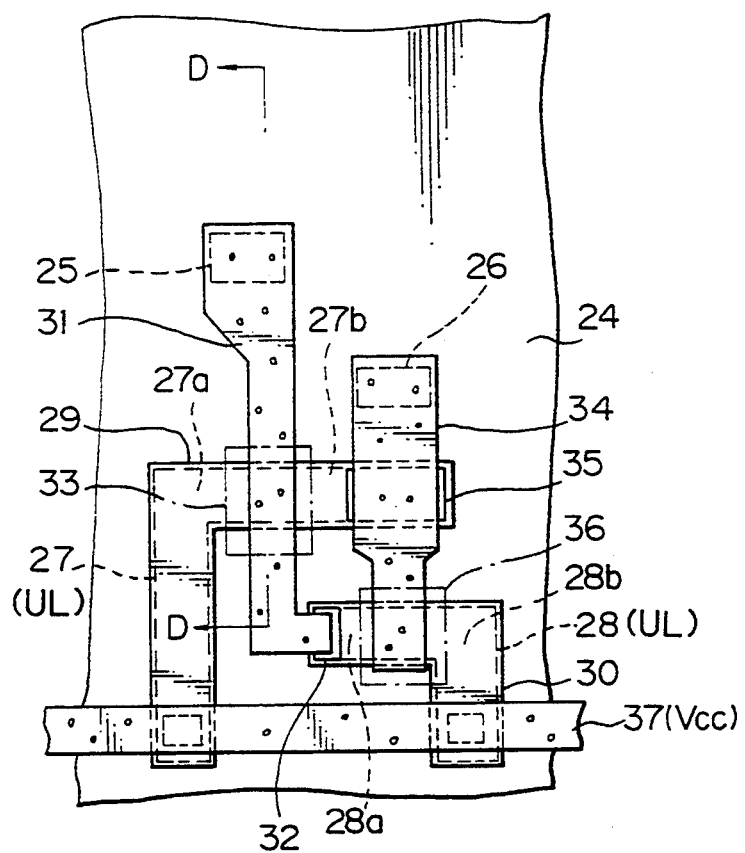
FIG. 10 is a plan view showing a configuration of an upper layer of the memory cell in the embodiment of the SRAM according to the present invention.
Figure 11:
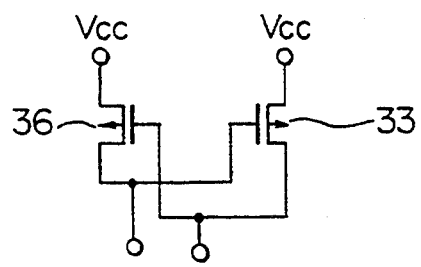
FIG. 11 is a circuit diagram showing the configuration of the upper layer shown in FIG. 10.

FIG. 10 is a plan view showing a configuration of an upper layer of the memory cell in the embodiment of the SRAM according to the present invention, and FIG. 11 is a circuit diagram showing the configuration of the upper layer shown in FIG. 10.

In FIG. 10, a reference numeral 24 denotes an interlayer insulation film formed over N-channel type MOS transistors 2, 3, 4, and 5. An eighth contact hole 25 is formed in the interlayer insulation film 24 at the portion above the second contact hole 12 formed in the thermal oxide film 8, and a ninth contact hole 26 is formed in the interlayer insulation film 24 at the portion above the fifth contact hole 19 formed in the thermal oxide film 8. Further, N-type melt-recrystallization layers 27 and 28 each shaped as a character of "L" are formed onto the interlayer insulation film 24, and an oxide film 29 and 30 are formed on the melt-recrystallization layers 27 and 28 by using a thermal oxidation method.

Further, a reference numeral 31 denotes a fourth gate electrode layer formed above a first N-type melt-recrystallization layer 27 via the oxide film 29 crossing the first melt-recrystallization layer 27, and the fourth gate electrode layer 31 is made of polycrystal silicon by using a chemical vapor deposition (CVD) method. Note, one end of the fourth gate electrode layer 31 extends into a seventh contact hole 32 formed in the oxide film 30, and the oxide film 30 is formed onto a second N-type melt-recrystallization layer 28. Further, the other end of the fourth gate electrode layer 31 extends into the eighth contact hole 25 formed in the interlayer insulation film 24, and it is electrically connected to the second gate electrode layer 15 and the drain region (N-type diffusion region) 2a of the N-channel type MOS transistor 2 in the second contact hole 12 (referring to FIGS. 8 and 12). In the first N-type melt-recrystallization layer 27, P-type diffusion regions 27a and 27b are formed on both sides of the fourth gate electrode layer 31 by injecting P-type impurities, so that a first P-type MOS transistor 33 is constituted.

Furthermore, in FIG. 10, a reference numeral 34 denotes a fifth gate electrode layer formed above the second melt-recrystallization layer 28 via the oxide film 30, and the fifth gate electrode layer 34 is made of polycrystal silicon by using a CVD method. Note, one end of the fifth gate electrode layer 34 is electrically connected to the P-type diffusion region 27b through a tenth contact hole 35 formed in the oxide film 29 above the first melt-recrystallization layer 27, and it extends into the ninth contact hole 26 formed in the interlayer insulation film 24 to electrically connect to the third gate electrode 18 and the element connection region 6 shown in FIG. 8. Further, in the second N-type melt-recrystallization layer 28, P-type diffusion regions 28a and 28b are formed on both sides of the fifth gate electrode layer 34 by injecting P-type impurities, so that a second P-type MOS transistor 36 is constituted.

In the above description, two P-channel type MOS transistors 33 and 36 are formed on the interlayer insulation film 24 (upper layer UL), and the two P-channel type MOS transistors 33 and 36 are connected as in the circuit diagram shown in FIG. 11. Namely, as shown in FIG. 11, a drain of a first P-channel type MOS transistor 33 is connected to a gate (fifth gate electrode layer 34) of a second P-channel type MOS transistor 36, and a gate (fourth gate electrode layer 31) of the first P-channel type MOS transistor 33 is connected to a drain of the second P-channel type MOS transistor 36.

Figure 13:
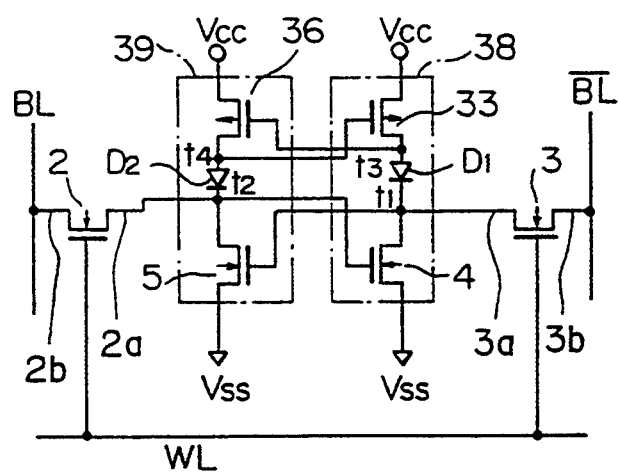
FIG. 13 is a circuit diagram showing the memory cell in the SRAM shown in FIG. 12.

As described above, the four N-channel type MOS transistors 2 to 5 are formed in the lower layer LL, and the two P-channel type MOS transistors 33 and 36 are formed on the upper layer UL. Note, a diode $D_2$ is formed at the connection portion between the fourth gate electrode layer 31 made of P-type polycrystal silicon and the drain region 2a made of N-type diffusion region. Namely, as shown in FIG. 13, the diode $D_2$ is provided between a node $t_4$ corresponding to the drain of the second P-channel type MOS transistor 36, or the gate of the first P-channel type MOS transistor 33) and a node $t_2$ corresponding to the drain region 2a of the first N-channel type MOS transistor 2. Similarly, the diode $D_1$ is provided between a node $t_3$ and a node $t_1$. Note, these diodes $D_1$ and $D_2$ are inevitably formed by P-N junctions of the P-type polycrystal silicon and the drain regions, and they are not injurious to the memory cell for the SRAM, but they are useful for decreasing leakage currents thereof.

Consequently, as shown in FIG. 13, the drain of the first P-channel type MOS transistor 33 is connected to the drain of the third N-channel type MOS transistor 4 through the diode $D_1$, and the drain of the second P-channel type MOS transistor 36 is connected to the drain of the fourth N-channel type MOS transistor 5 through the diode $D_2$, so that a memory cell for the SRAM constituted by four N-channel type MOS transistors and two P-channel type MOS transistors is provided. Note, in FIG. 10, a reference numeral 37 denotes an electrode wiring which is electrically connected to a source (27a) of the first P-channel type MOS transistor 33 and a source (28b) of the second P-channel type MOS transistor 36. Further, in FIG. 13, a reference numeral 38 denotes a first CMOS inverter circuit constituted by the first P-channel type MOS transistor 33 and the third N-channel type MOS transistor 4, and 39 denotes a second CMOS inverter circuit constituted by the second P-channel type MOS transistor 36 and the fourth N-channel type MOS transistor 5.

Figure 12:
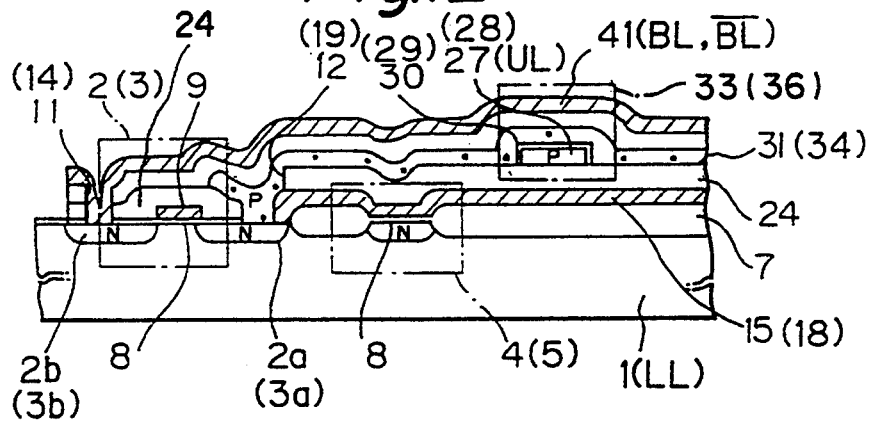
FIG. 12 is a sectional diagram showing a first embodiment of the memory cell in the SRAM according to the present invention.

FIG. 12 is a sectional diagram showing a first embodiment of the memory cell in the SRAM according to the present invention, and corresponds to the sectional diagram of the memory cell shown in FIG. 8 by cutting along a cutting line C—C or the memory cell shown in FIGS. 10 by cutting along cutting line D—D.

As described above, it is obviously indicated in FIG. 12 that the fourth gate electrode layer 31 (which is the gate of the P-channel type MOS transistor 33) made of polycrystal silicon by using a CVD method extends into the second contact hole 12 formed in the the interlayer insulation film 24 in order to electrically connect the gate of the transistor 33 to the N-type diffusion region 2a of the N-channel type MOS transistor 2 (the drain of the transistor 2), and thus an aspect ratio of the contact hole 12 becomes small and a coverage of the fourth gate electrode layer 31 (polycrystal silicon wiring) is improved, so that the polycrystal silicon wiring is not snapped.

In the above description, only the configuration of transistors 2, 4, and 33 is mainly explained, and a configuration of transistors 3, 5, and 36 is the same as that of transistors 2, 4, and 33. Therefore, the fifth gate electrode layer 34 (which is the gate of the P-channel type MOS transistor 36) made of polycrystal silicon by using a CVD method extends into the fifth contact hole 19 formed in the the interlayer insulation film 24 in order to electrically connect the gate of the transistor 36 to an N-type diffusion region 3a of the N-channel type MOS transistor 3 (the drain of the transistor 3), and thus an aspect ratio of the contact hole 19 becomes small and a coverage of the fourth gate electrode layer 34 (polycrystal silicon wiring) is improved, so that the polycrystal silicon wiring is not snapped.

Note, in the above embodiment shown in FIG. 12, when there is a high degree of integration of the memory cell for the SRAM, for example, an electrical connection between the fourth gate electrode layer 31 and the second gate electrode 15 may not be sufficient. Namely, when the contact hole 12 (19) is formed with an extremely small shape, the gate electrode layer 31 (34) made of P-type polycrystal silicon is not sufficiently connected to the second gate electrode 15 (18) made of N-type tungsten silicide, because when directly contacting the P-type polycrystal silicon layer 31 (34) onto the N-type tungsten silicide layer 15 (18), P-type impurities in the P-type polycrystal silicon layer 31 (34) are diffused into the N-type tungsten silicide layer 15 (18), so that an electrical contact between the P-type polycrystal silicon layer 31 (34) and the N-type tungsten silicide layer 15 (18) is not sufficient. In this case, when directly forming the N-type tungsten silicide layer 15 (18) onto the N-type diffusion region 2a (3a) with a considerable connecting area (with reference to the extremely small contact hole), the electrical contact can be obtained.

Figure 14:
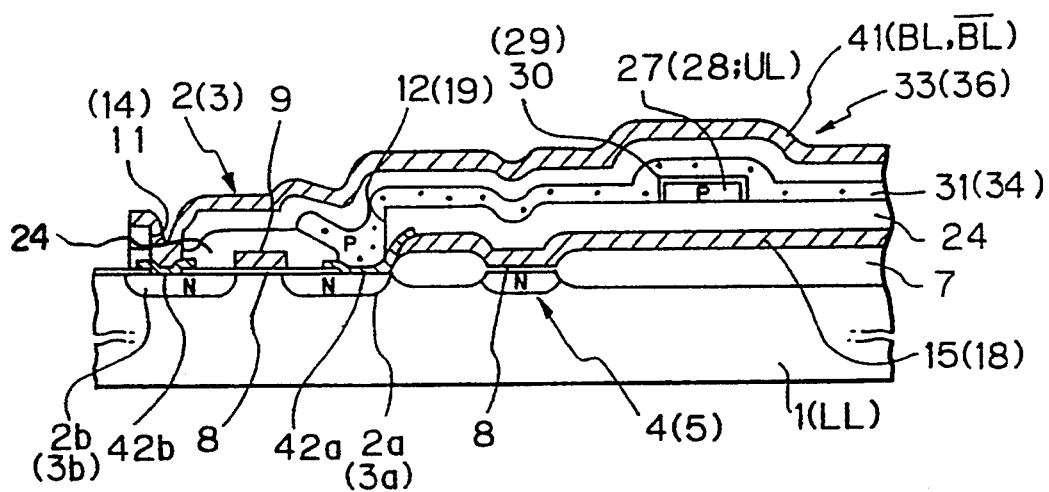
FIG. 14 is a sectional diagram showing a second embodiment of the memory cell in the SRAM according to the present invention.

FIG. 14 is a sectional diagram showing a second embodiment of the memory cell in the SRAM according to the present invention in order to obtain sufficient electrical connection between the P-type polycrystal silicon layer 31 (34) and the N-type tungsten silicide layer 15 (18), when the contact hole 12 (19) is formed with an extremely small shape. Note, the memory cell shown in FIG. 14 is similar to the memory cell shown in FIG. 12, except that polycrystal silicon pads 42a and 42b are provided in the memory cell shown in FIG. 14. Namely, as shown in FIG. 14, the polycrystal silicon pad 42a is formed on an end of the second gate electrode layer 15 and the drain region 2a of the first N-channel type MOS transistor 2, and an end of the fourth gate electrode layer 31 is formed on the polycrystal silicon pad 42a. Note, the drain region 2a of the first N-channel type MOS transistor 2 is made of N-type ($N^+$-type) diffusion region, the second gate electrode layer 15 is made of N-type tungsten silicide ($WSi_2$/poly-Si: 2000/1000Å), the fourth gate electrode layer 31 is made of P-type polycrystal silicon, and the polycrystal silicon pad 42a is made of N-type ($N^-$-type) polycrystal silicon, so that an electrical connection between the fourth gate electrode layer 31 and the drain region 2a or the fourth gate electrode layer 31 and the second gate electrode layer 15 can be improved.

Furthermore, at the contact hole 12, when forming the polycrystal silicon pad 42a on the N-type diffusion region (drain region) 2a, a depth of the contact hole 12 becomes shallower, and thus an aspect ratio of the contact hole 12 becomes small. Similarly, at the contact hole 11, when forming the polycrystal silicon pad 42b on the N-type diffusion region (source region) 2b, a depth of the contact hole 11 becomes shallower, and thus an aspect ratio of the contact hole 11 becomes small. Consequently, an aluminium wiring 41 for a bit line BL can be sufficiently connected to the source region 2b without causing it to snap. Note, the polycrystal silicon pad 42b in the contact hole 11 can be formed in the same process for forming the polycrystal silicon pad 42a in the contact hole 12. Further, the diode $D_1$ between the gate of the first P-channel type MOS transistor 33 and the drain of the first N-channel type MOS transistor 2 is formed at the connection portion between the upper surface of the polycrystal silicon pad 42a and the end of the fourth gate electrode layer 31.

Note, in the above description, only the configuration of transistors 2, 4, and 33 is mainly explained, and a configuration of transistors 3, 5, and 36 is the same as that of transistors 2, 4, and 33. Therefore, in a contact hole 19, a polycrystal silicon pad 42a is formed on an end of a third gate electrode layer 18 and a drain region 3a of a second N-channel type MOS transistor 3, and an end of a fifth gate electrode layer 34 is formed on the polycrystal silicon pad 42a, and an electrical connection between the fifth gate electrode layer 34 and the drain region 3a or the fifth gate electrode layer 34 and the third gate electrode layer 18 can be improved and an aspect ratio of the contact hole 14 becomes small. Similarly, at a contact hole 14, when forming a polycrystal silicon pad 42b on an N-type diffusion region (source region) 3b of a second N-channel type MOS transistor 3, a depth of the contact hole 14 becomes shallower, and thus an aspect ratio of the contact hole 14 becomes small. Consequently, an aluminium wiring 41 for a bit line BL can be sufficiently connected to the source region 3b without causing it to snap. Note, the polycrystal silicon pad 42b in the contact hole 14 can be formed in the same process for forming the polycrystal silicon pad 42a in the contact hole 19.

Next, an operation of the circuit diagram of the memory cell in the SRAM shown in FIG. 13 or FIG. 14 will be explained.

First, when writing data into a memory cell, a high level signal "H" is applied to a bit line BL, a low level signal "L" is applied to a bit line $\overline{BL}$, and a high level signal "H" is applied to a word line WL, so that two switching transistors 2, 3 which are constituted by N-channel type MOS transistors are switched ON, and the node $t_2$ is at a high level "H" and the node $t_1$ ($t_3$) is at a low level "L". Namely, the gate of the N-channel type MOS transistor 4 in the first CMOS inverter circuit 38 is at the high level "H", and the gate of the N-channel type MOS transistor 5 in the second CMOS inverter circuit 39 is at the low level and the gate of the P-channel type MOS transistor 36 in the second CMOS inverter circuit 39 is at a low level "L", so that the transistors 4 and 36 are switched ON and the transistor 5 is switched OFF. Note, a level of the node $t_4$ is maintained at a high level "H". Further, a current flowing from the node $t_3$ to the node $t_1$ is not interrupted by a diode $D_2$ formed therebetween, and a current flowing from the node $t_4$ to the node $t_2$ is not interrupted by a diode $D_1$ formed therebetween. In addition, when changing the level of the word line from the high level "H" to a low level "L", the state of the memory cell is not changed.

Next, when reading out data from the memory cell, a high level signal "H" is applied to the word line WL, the bit line BL is brought to a high level "H", and the bit line $\overline{BL}$ is brought to a low level "L". Then, a state of the memory cell is discriminated by reading out the levels of the bit lines BL and $\overline{BL}$. Note, when changing the levels applied to the bit lines BL and $\overline{BL}$ to opposite levels at the time of writing, the levels read out from the bit lines BL and $\overline{BL}$ are inverted.

Note, in the above descriptions, embodiments having two P-channel type MOS transistors formed on the upper layer and four N-channel type MOS transistors formed on the lower layer are explained, but these transistors can be changed to opposite types. Namely, a memory cell for a SRAM having two N-channel type MOS transistors formed on the upper layer and four P-channel type MOS transistors formed on the lower layer can be provided in accordance with the present invention. Note, in this case, a current should be flown from a P-type diffusion region of the P-channel type MOS transistor (corresponding to the N-type diffusion region 2a in the above embodiments) to a polycrystal silicon layer connected to a gate of the N-channel type MOS transistor (corresponding to the fourth gate electrode layer 31).

Many widely differing embodiments of the present invention may be constructed without departing from the spirit and scope of the present invention, and it should be understood that the present invention is not limited to the specific embodiments described in this specification, except as defined in the appended claims.

I claim:

1. A static random access memory device having a plurality of memory cells formed as a three-dimensional configuration, each of said memory cells including:

a lower layer formed on a substrate, said substrate being constituted by a silicon substrate;

a plurality of first conductivity type MIS transistors formed on said lower layer;

an interlayer insulation film formed on said first conductivity type MIS transistors, and over said lower layer;

an upper layer formed on said interlayer insulation film, said upper layer being constituted by a melt-recrystallization layer;

a plurality of second conductivity type MIS transistors formed on said upper layer;

a contact hole formed in said interlayer insulation film at the portion above a diffusion region of one of said first conductivity type MIS transistors;

a continuous polycrystal silicon film layer forming the gate of one of said second conductivity type MIS transistors extending continuously from said gate region and directly connected to said diffusion region through said contact hole; and a polycrystal silicon pad provided at a connection portion between said polycrystal silicon film layer and said diffusion region.

2. A static random access memory device as claimed in claim 1, wherein a gate electrode layer of another one of said first conductivity type MIS transistors is connected to said diffusion region through said polycrystal silicon pad.

3. A static random access memory device as claimed in claim 2, wherein said gate electrode layer of said another one of said first conductivity type MIS transistors is made of N-type tungusten silicide.

4. A static random access memory device as claimed in claim 1, wherein said first conductivity type MIS transistors are constituted by a first, second, third, and fourth N-channel type MIS transistors, and said second conductivity type MIS transistors are constituted by a fifth and sixth P-channel type MIS transistors.

5. A static random access memory device as claimed in claim 4, wherein said memory cell is constituted by a first CMIS inverter consisting of the fifth transistor of said P-channel type and the third transistor of said N-channel type, a second CMIS inverter consisting of the sixth transistor of said P-channel type and the fourth transistor of said N-channel type, and two switching transistors of the first and the second transistors of said N-channel type, wherein an output of-said first CMIS inverter is connected to an input of said second CMIS inverter, an output of said second CMIS inverter is connected to an input of said first CMIS inverter, gates of said two switching transistors are connected to a word line, and sources of said two switching transistors are connected to bit lines.

6. A static random access memory device as claimed in claim 5, wherein a first diode is provided between the fifth transistor and the third transistor in said first CMIS inverter, and a second diode is provided between the sixth transistor and the fourth transistor in said second CMIS inverter.

7. A static random access memory device as claimed in claim 1, wherein said polycrystal silicon film layer constitutes a gate electrode of one of said second conductivity type MIS transistors.

8. A static random access memory device as claimed in claim 1, wherein said diffusion region is specified as a drain region of an N-channel type MIS switching transistor of said memory cell.

9. A static random access memory device having a plurality of memory cells formed as a three-dimensional configuration, each of said memory cells including:
    a lower layer formed on a substrate, said substrate being constituted by a silicon substrate;
    four MIS transistors of a first conductivity type formed on said lower layer;
    an interlayer insulation film formed on said first conductivity type MIS transistors, and over said lower layer;
    an upper layer formed on said interlayer insulation film, said upper layer being constituted by a melt-recrystallization layer;
    two MIS transistors of a second conductivity type formed on said upper layer;
    a first contact hole formed in said interlayer insulation film at the portion above a first diffusion region of one of said first conductivity type MIS transistors;
    a metal wiring layer connected to said first diffusion region through said first contact hole;
    a second contact hole formed in said interlayer insulation film at the portion above a second diffusion region of one of said first conductivity type MIS transistors;
    a continuous polycrystal silicon film layer forming the gate interface of one of said second conductivity type MIS transistors extending continuously and formed on said interlayer insulation film from said gate and connected to said second diffusion region through said second contact hole; and
    a first polycrystal silicon pad and a second polycrystal silicon pad, said first polycrystal silicon pad being provided at a connection portion between said metal wiring layer and said first diffusion region, and said second polycrystal silicon pad being provided at a connection portion between said continuous polycrystal silicon film layer and said second diffusion region.

10. A static random access memory device as claimed in claim 9, wherein a gate electrode layer of another one of said first conductivity type MIS transistors is connected to said second diffusion region through said second polycrystal silicon pad.

11. A static random access memory device as claimed in claim 10, wherein said gate electrode layer of said another one of said first conductivity type MIS transistors is made of N-type tungusten silicide.

12. A static random access memory device as claimed in claim 9, wherein said four MIS transistors of said first conductivity type are constituted by a first, second, third, and fourth transistors of an N-channel type, and said two MIS transistors of said second conductivity type are constituted by a fifth and sixth transistors of P-channel type.

13. A static random access memory device as claimed in claim 12, wherein said memory cell is constituted by a first CMIS inverter consisting of said fifth MIS transistor and said third MIS transistor, a second CMIS inverter consisting of said sixth MIS transistor and said fourth MIS transistor, and two switching transistors of said first and second MIS transistors, wherein an output of said first CMIS inverter is connected to an input of said second CMIS inverter, an output of said second CMIS inverter is connected to an input of said first CMIS inverter, gates of said two switching transistors are connected to a word line, and sources of said two switching transistors are connected to bit lines.

14. A static random access memory device as claimed in claim 13, wherein a first diode is provided between said fifth MIS transistor and said third MIS transistor, and a second diode is provided between said sixth MIS transistor and said fourth MIS transistor.

15. A static random access memory device as claimed in claim 9, wherein said polycrystal silicon film layer constitutes a gate electrode of one of said second conductivity type MIS transistors.

16. A static random access memory device as claimed in claim 9, wherein said metal wiring layer is specified as a bit line.

17. A static random access memory device as claimed in claim 9, wherein said first diffusion region is specified as a source region of an N-channel type MIS switching transistor of said memory cell, and said second diffusion region is specified as a drain region of said N-channel type MIS switching transistor.

* * * * *